(12) United States Patent
Ueda

(10) Patent No.: US 7,005,683 B2
(45) Date of Patent: Feb. 28, 2006

(54) RESIN-PACKAGED LED LIGHT SOURCE

(75) Inventor: Takashi Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 139 days.

(21) Appl. No.: 10/394,489

(22) Filed: Mar. 19, 2003

(65) Prior Publication Data
US 2004/0080268 A1  Apr. 29, 2004

(30) Foreign Application Priority Data
Mar. 27, 2002 (JP) .................................... 2002-089129

(51) Int. Cl.
H01L 29/22 (2006.01)

(52) U.S. Cl. ........................ 257/99; 257/98; 257/100
(58) Field of Classification Search ............ 257/98–100
See application file for complete search history.

(56) References Cited

U.S. PATENT DOCUMENTS

| 4,013,915 A | * | 3/1977 | Dufft ........................... 313/499 |
| 5,436,472 A |   | 7/1995 | Ogawa |
| 5,607,227 A | * | 3/1997 | Yasumoto et al. .......... 362/249 |
| 6,213,650 B1 | * | 4/2001 | Moriyama et al. ............ 385/88 |
| 6,252,252 B1 | * | 6/2001 | Kunii et al. ................... 257/81 |
| 6,459,099 B1 |   | 10/2002 | Sano |
| 6,611,001 B1 | * | 8/2003 | Cappuzzo et al. ............ 257/81 |
| 2002/0134988 A1 | * | 9/2002 | Ishinaga ....................... 257/99 |

* cited by examiner

Primary Examiner—Hoai Pham
Assistant Examiner—Nathan W. Ha
(74) Attorney, Agent, or Firm—Merchant & Gould P.C.

(57) ABSTRACT

An LED light source includes a rectangular LED chip and a transparent resin package enclosing the LED chip. The resin package is provided with a lens portion for directing light emitted from the LED chip to the outside of the resin package. The LED chip includes two adjacent side surfaces oriented toward the lens portion.

7 Claims, 4 Drawing Sheets

RESIN-PACKAGED LED LIGHT SOURCE

BACKGROUND OF THE INVENTION

1. Field of the Invention

The present invention relates to a resin-packaged LED light source for use in a photointerrupter, for example.

2. Description of the Related Art

FIG. 3 illustrates an example of prior art LED light source. The illustrated LED light source 101 is made as a light emitting unit of a photointerrupter. The light source 101 includes a rectangular LED chip 102 and a resin package 3 enclosing the chip.

The LED chip 102 has a chip body 21 including a light emitting layer 21c. The chip body 21 has a lower surface formed with a lower electrode 22 and an upper surface formed with an upper electrode 23. When a predetermined voltage is applied across the lower electrode 22 and the upper electrode 23, light is emitted from the light emitting layer 21c. More specifically, light is emitted radially from a certain point of the light emitting layer 21c.

The package 3 is formed of a resin which is transparent relative to the light emitted from the light emitting layer 21c. As shown in FIG. 3, the package 3 comprises a rectangular main body 31 and a convex lens portion 6 formed at one side surface of the main body 31. Though not illustrated in the figure, the package 3 is covered with a light shielding film except for the lens portion 6. The light emitted from the light emitting layer 21c is directed to the outside of the package 3 through the lens portion 6.

Referring to FIG. 4, a flat boundary surface 5 can be hypothetically defined between the package body 31 and the lens portion 6. In the prior art LED light source 101, the LED chip is arranged so that one side surface 21c1 of the light emitting layer 21c extends in parallel with the boundary surface 5. Due to such an arrangement, the prior art light source has the following disadvantages.

As described above, when a voltage is applied across the lower electrode 22 and the upper electrode 23, light is emitted from a certain point of the light emitting layer 21c. FIG. 4 illustrates the travel route of light emitted from a light emitting point O located at the center of the light emitting layer 21c. As shown in the figure, the light emitted from the light emitting point O travels in a triangular region having an apex angle (diffusion angle) α. Thereafter, the light is refracted in exiting the light emitting layer 21c to enter the resin package 3. The refractive index of the light emitting layer 21c is larger than that of the resin package 3. Therefore, the light entering the resin package 3 travels in a triangular region having a diffusion angle β which is larger than the angle α. (The diffusion angle α may be 8.4° for example, whereas the diffusion angle β may be 20°, for example.) Then, the light is directed to the outside of the package 3 through the lens portion 6.

With such a structure, only a small portion of the light emitted from the light emitting point is directed to the outside of the package 3. Specifically, when the diffusion angle α is 8.4°, only about 2.3% (=8.4÷360) of the light is directed to the outside of the package 3. Therefore, for irradiating an object with a sufficient amount of light, the power consumption increases or a large LED chip need be used, which is disadvantageous.

SUMMARY OF THE INVENTION

The present invention, which is conceived under the circumstances described above, has an object to provide an LED light source which is capable of emitting a larger amount of light through the package than a prior art device while avoiding an increase in power consumption or an increase in size of the device.

An LED light source provided according to the present invention comprises a rectangular LED chip, and a resin package which encloses the LED chip and which is transparent relative to the light emitted from the LED chip. The resin package includes a light exit portion for directing light emitted from the LED chip out of the resin package. The LED chip includes two adjacent side surfaces oriented toward the light exit portion.

Preferably, the LED chip includes a diagonal, and an extension of the diagonal extends through the light exit portion.

Preferably, the extension of the diagonal intersects the center of the light exit portion perpendicularly.

Preferably, the light exit portion includes a convex lens portion.

Preferably, the package is covered with a light shielding member except for the convex lens portion. Preferably, the LED light source further comprises an electrode, and the LED chip has one surface entirely covered with the electrode.

Preferably, the LED chip includes a light emitting layer having a refractive index larger than a refractive index of the package.

Other objects, features and advantages of the present invention will become clearer from the description of the preferred embodiment given below.

DETAILED DESCRIPTION OF THE PREFERRED EMBODIMENTS

Preferred embodiments of the present invention will be described below in detail with reference to the accompanying drawings.

Figure 1:
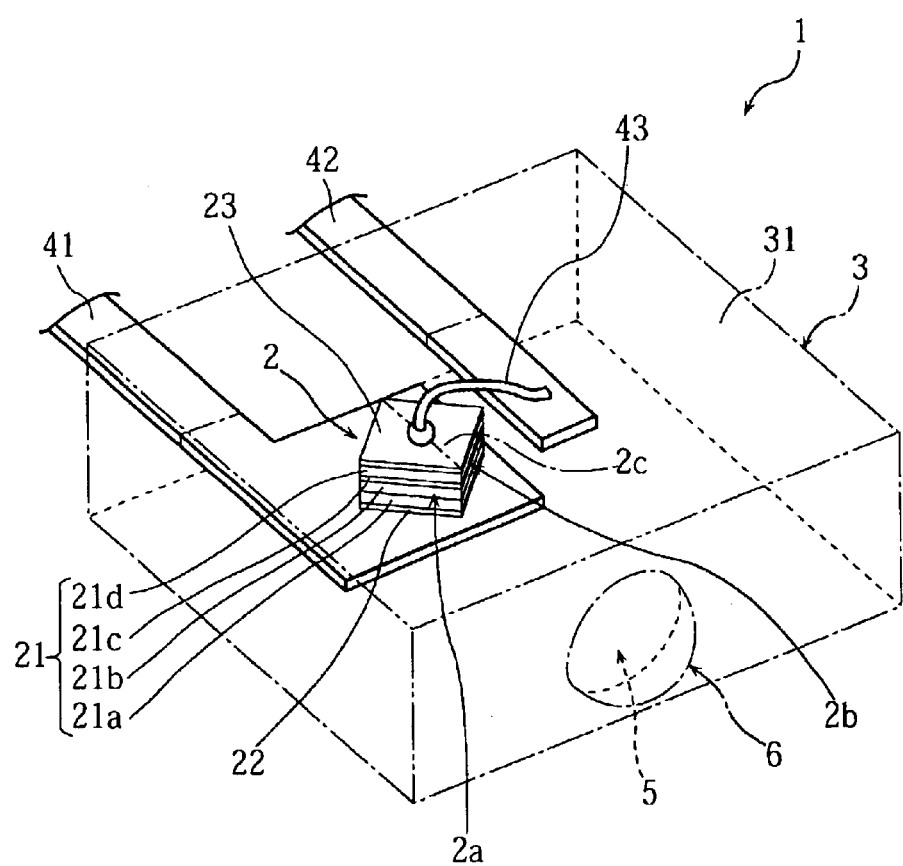
FIG. 1 is a perspective view illustrating an LED light source according to the present invention.
Figure 2:
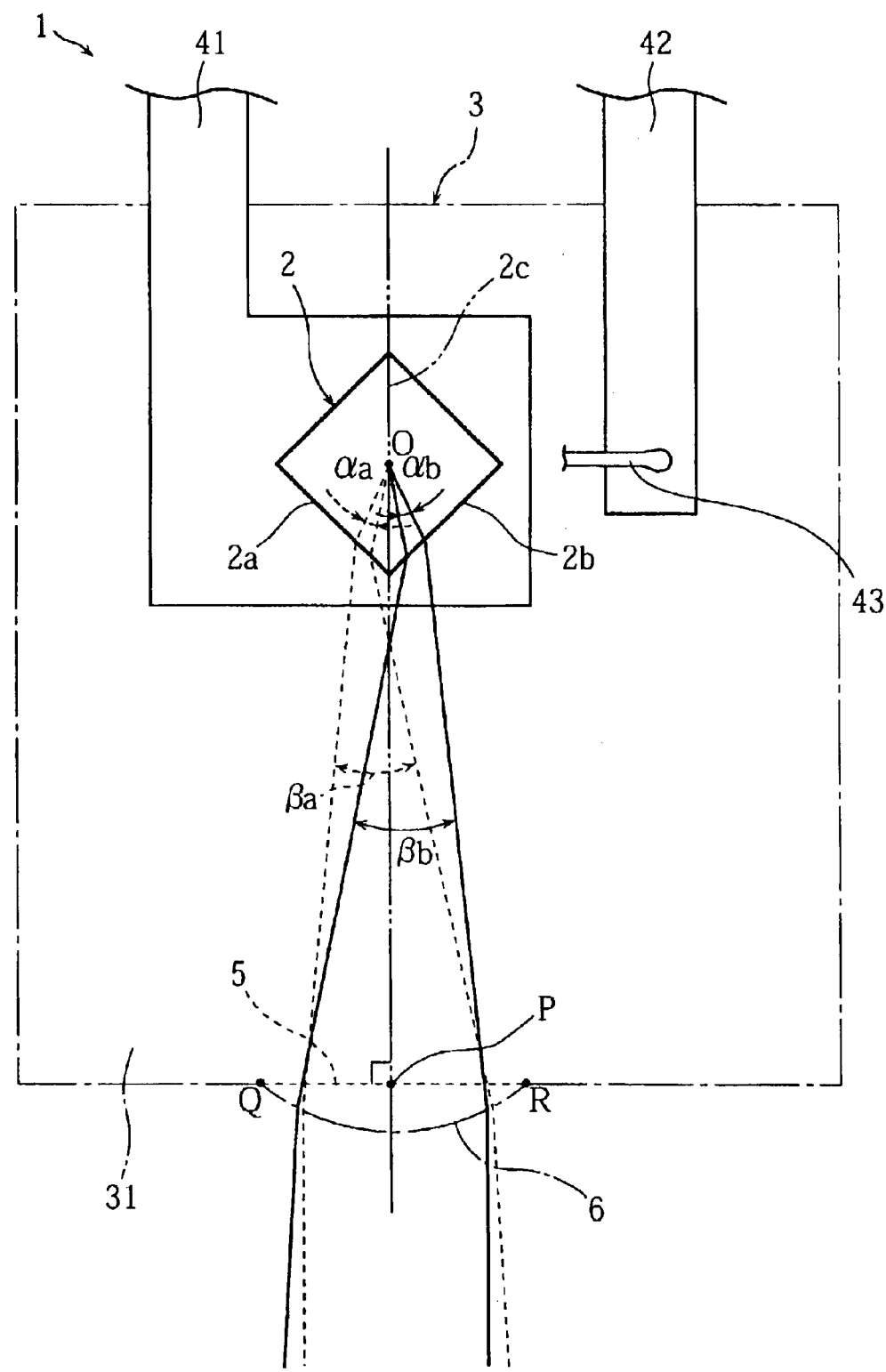
FIG. 2 is a plan view illustrating the light source of FIG. 1.
Figure 3:
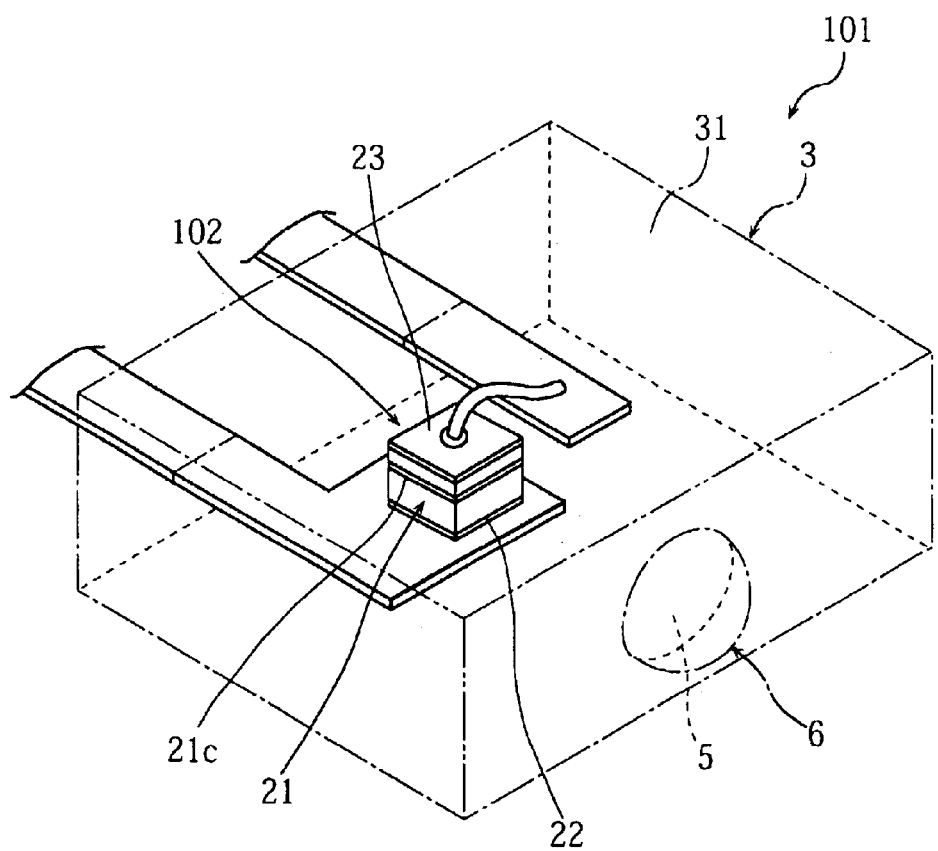
FIGS. 3 and 4 illustrate a prior art LED light source.

FIG. 1 is a perspective view illustrating an LED light source according to the present invention, and FIG. 2 is a plan view illustrating the LED light source of FIG. 1. In these figures, the structural parts which are identical or similar to those of the prior art LED light source (FIGS. 3 and 4) are designated by the same reference signs.

The LED light source 1 shown in FIG. 1 includes an LED chip 2 and a resin package 3 enclosing the chip. The LED chip 2 includes a chip body 21 comprising a plurality of semiconductor layers laminated one on top of another. Specifically, a P-type semiconductor layer 21b, a light emitting layer (active layer) 21c and an N-type semiconductor layer 21d are formed on a substrate 21a.

The chip body 21 has a lower surface formed with a lower electrode 22 and an upper surface formed with an upper electrode 23. The lower electrode 22, which is formed of a metal having a high conductivity (for example, Au), entirely covers the lower surface of the chip body 21. The upper electrode 23, which is formed of the same metal as that of the lower electrode 22, entirely covers the upper surface of the chip body 21.

The LED chip 2 having the above-described structure may be made as follows, for example. First, a substrate formed of GaAs is prepared. Subsequently, a P-type GaAlAs cladding layer, a GaAlAs active layer and an N-type GaAlAs cladding layer are formed successively on the substrate by epitaxial growth, thereby providing a semiconductor wafer. Then, a film made of a conductive material is formed on the upper surface and the lower surface of the semiconductor substrate. Finally, the semiconductor wafer is divided into a plurality of individual chips. As clearly shown in FIG. 2, the LED chip 2 is square in plan view.

The LED chip 2 obtained in the above-described manner is packaged with resin. In the embodiment shown in FIGS. 1 and 2, the LED chip 2 is disposed on a first lead 41 in the resin package 3 so that the lower electrode 22 is electrically connected to the first lead 41. The upper electrode 23 of the chip 2 is connected to a second lead 42 via a wire 43. The first and the second leads 41 and 42 are formed of copper or iron, for example.

The package 3 is formed of a resin which is transparent relative to the light emitted from the LED chip 2. As such a resin, use may be made of a light-permeable epoxy resin which does not contain filler. The resin package 3 can be formed as follows. Firstly, after the LED chip 2 is bonded to the first lead 41, the upper electrode 23 of the LED chip 2 is connected to the second lead 42 by wire bonding. Subsequently, the LED chip 2 together with portions of the leads 41 and 42 are set in a cavity of a mold. Thereafter, molten resin material is injected into the cavity, and finally the injected resin is solidified.

The resin package 3 comprises a package body 31 and a convex lens portion 6 formed at one side surface of the package body 31. The resin package 3 is provided with a light shielding film (not shown) except for the portion formed with the lens portion 6. As shown in FIG. 2, a flat boundary surface 5 can be hypothetically defined between the package body 31 and the lens portion 6.

The LED light source 1 of the present invention differs from the prior art light source (FIGS. 3 and 4) in the following points.

Figure 4:
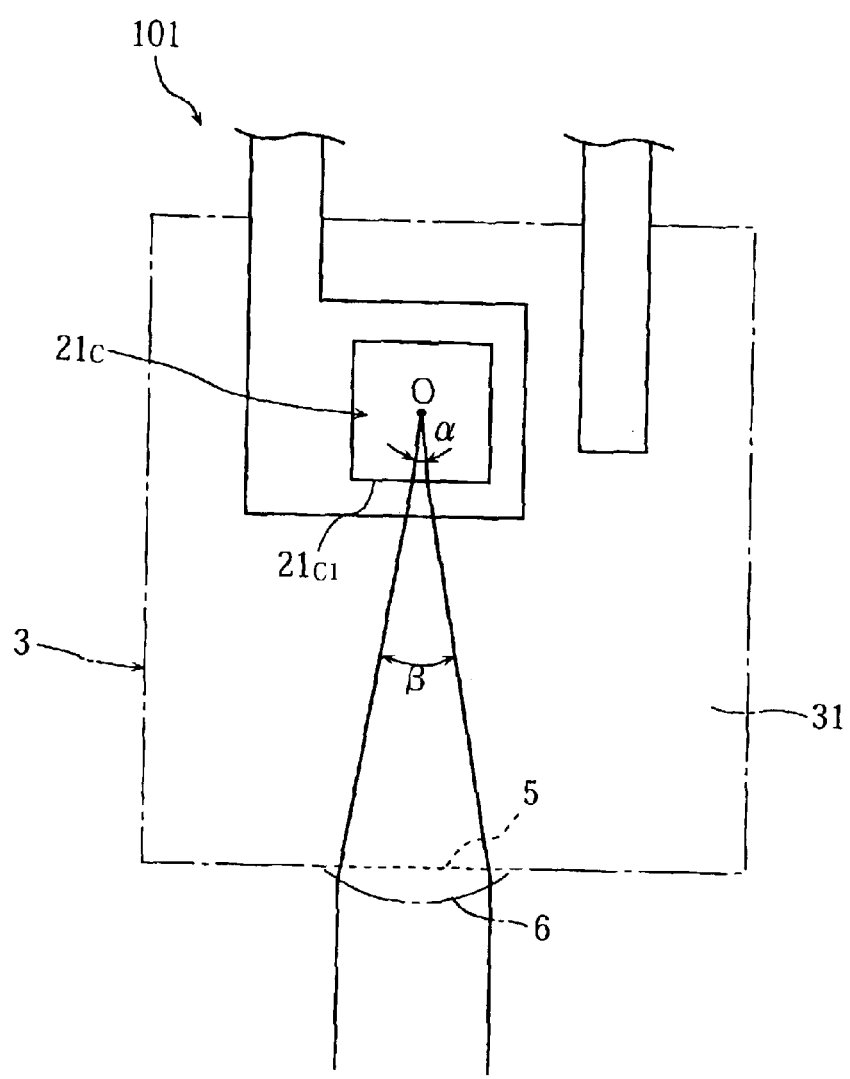

As described with reference to FIG. 4, in the prior art structure, one side surface 21c1 of the light emitting layer 21c of the semiconductor chip extends in parallel with the boundary surface 5 indicated by broken lines. However, the LED light source 1 of the present invention does not employ such a structure. Specifically, as shown in FIG. 2, the LED chip 2 is mounted on the first lead 41 so that an extension of a diagonal 2c intersects the boundary surface 5 at a right angle. Further, in the illustrated embodiment, the intersection point P coincides with the middle point of a segment QR which corresponds to the boundary surface 5. Therefore, two adjacent side surfaces 2a and 2b are oriented obliquely with respect to the boundary surface 5.

The operation of the LED light source 1 having the above-described structure will be described below.

When a predetermined voltage is applied across the lower and the upper electrode 22 and 23 of the LED light source 1, light is emitted from the light emitting layer 21c. Similarly to the prior art light source, the light is refracted in entering the resin package 3 from the light emitting layer 21c. In the prior art light source (See FIG. 4), the light emitted from the center point O travels along a single route before reaching the lens portion 6. However, in the present invention, there exist two routes along which the light can travel before reaching the lens portion 6.

Specifically, as shown in FIG. 2, part of the light emitted from the center point O passes through the side surface 2a before reaching the lens portion 6 (the first route), whereas another part of the light passes through the side surface 2b before reaching the lens portion 6 (the second route). As shown in FIG. 2, two diffusion angles $\alpha a$, $\beta a$ can be set for the first route, and two diffusion angles $\alpha b$, $\beta b$ can be set for the second route. Through experiments, the inventor has found that when both of the diffusion angles $\beta a$, $\beta b$ are 20° (which are equal to the diffusion angle $\beta$ of the prior art light source), both of the angles $\alpha a$ and $\alpha b$ become about 6°.

The above-described results indicate that approximately 3.3% (=(6+6)÷360) of the light emitted from the center point O is emitted to the outside of the package 3. This value is about 1.43 times (=($\alpha a+\alpha b$)÷$\alpha$) of that of the prior art light source. Therefore, according to the present invention, the light emission amount generally equal to that of the prior art light source can be obtained using an LED of a light output smaller than that of the prior art light source. Generally, an LED chip of a smaller light output is less expensive and smaller than a chip of a larger light output. Therefore, the utilization of the light source according to the present invention makes it possible to form a photointerrupter which is small, is inexpensive and has a good performance.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

What is claimed is:

1. An LED light source comprising:
   a rectangular LED chip; and
   a resin package enclosing the LED chip, the resin package being transparent relative to light emitted from the LED chip;
   the resin package including a lens portion having an optical axis for directing light emitted from the LED chip out of the resin package;
   the LED chip including two adjacent light-emitting side surfaces inclined relative to the optical axis of the lens portion.

2. The LED light source according to claim 1, wherein the LED chip includes a rectangular or square top surface, the top surface of the chip including a diagonal having an extension extending through the lens portion.

3. The LED light source according to claim 2, wherein the extension of the diagonal coincides with the optical axis of the lens portion.

4. The LED light source according to claim 1, wherein the lens portion is convex.

5. The LED light source according to claim 4, wherein a light shielding member covers the package except for the convex lens portion.

6. The LED light source according to claim 1, further comprising an electrode, the LED chip having one surface entirely covered with the electrode.

7. The LED light source according to claim 1, wherein the LED chip includes a light emitting layer having a refractive index larger than a refractive index of the package.

* * * * *